US008811073B2

(12) United States Patent
Dieny

(10) Patent No.: US 8,811,073 B2
(45) Date of Patent: Aug. 19, 2014

(54) MAGNETIC DEVICE, AND METHOD FOR READING FROM AND WRITING TO SAID DEVICE

(75) Inventor: Bernard Dieny, Lans en Vercors (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 41 days.

(21) Appl. No.: 13/820,215

(22) PCT Filed: Aug. 31, 2011

(86) PCT No.: PCT/EP2011/065057
§ 371 (c)(1),
(2), (4) Date: Apr. 11, 2013

(87) PCT Pub. No.: WO2012/028664
PCT Pub. Date: Mar. 8, 2012

(65) Prior Publication Data
US 2013/0188421 A1 Jul. 25, 2013

(30) Foreign Application Priority Data

Sep. 1, 2010 (FR) ...................................... 10 56950

(51) Int. Cl.
| G11C 11/00 | (2006.01) |
| H01L 27/22 | (2006.01) |
| H01F 10/32 | (2006.01) |
| H01L 43/08 | (2006.01) |
| G11C 11/16 | (2006.01) |
| B82Y 25/00 | (2011.01) |

(52) U.S. Cl.
CPC ............ G11C 11/161 (2013.01); H01L 27/228 (2013.01); H01F 10/3254 (2013.01); H01L 43/08 (2013.01); H01F 10/3272 (2013.01); G11C 11/1673 (2013.01); B82Y 25/00 (2013.01); H01F 10/329 (2013.01); Y10S 977/933 (2013.01); Y10S 977/935 (2013.01)
USPC ........... 365/158; 365/148; 365/171; 365/173; 977/933; 977/935

(58) Field of Classification Search
CPC ....................................................... G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 977/933–935
See application file for complete search history.

(56) References Cited

U.S. PATENT DOCUMENTS 7,382,664 B2 * 6/2008 Le Phan ................... 365/189.04
7,545,672 B2 * 6/2009 Ueda et al. ..................... 365/158

(Continued)

FOREIGN PATENT DOCUMENTS

| FR | 2 817 999 A1 | 6/2002 |
| FR | 2 832 542 A1 | 5/2003 |
| WO | WO 2010/064476 | 6/2010 |

OTHER PUBLICATIONS

International Search Report as issued for PCT/EP2011/065057.

(Continued)

Primary Examiner — Harry W Byrne
(74) Attorney, Agent, or Firm — Pillsbury Winthrop Shaw Pittman LLP

(57) ABSTRACT

A magnetic device includes a reference layer, the magnetization direction of which is fixed, and a storage layer, the magnetization direction of which is variable. In a write mode, the magnetization direction of the storage layer is changed so as to store a "1" or a "0" in the storage layer. In a reading mode, the resistance of the magnetic device is measured so as to know what is stored in the storage layer. The magnetic device also includes a control layer, the magnetization direction of which is variable. The magnetization direction of the control layer is controlled so as to increase the effectiveness of the spin-transfer torque in the event writing to the storage layer is desired, and to decrease the effectiveness of the spin-transfer torque in the event reading the information contained in the storage layer, without modifying the information, is desired.

16 Claims, 6 Drawing Sheets

(56) References Cited

U.S. PATENT DOCUMENTS

Figure 5:
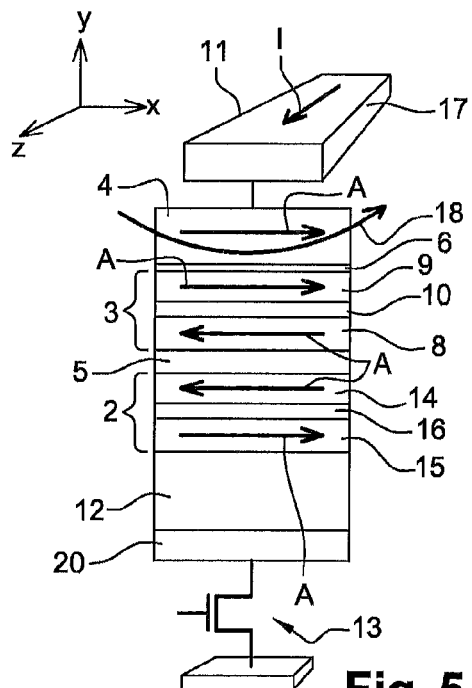

| | | | |
|---|---|---|---|
| 7,577,018 B2 * | 8/2009 | Kurisu | 365/158 |
| 7,577,019 B2 * | 8/2009 | Hung et al. | 365/158 |
| 7,613,033 B2 * | 11/2009 | Koga et al. | 365/158 |
| 7,649,766 B2 * | 1/2010 | Koga et al. | 365/158 |
| 7,668,005 B2 * | 2/2010 | Ueda | 365/158 |
| 7,697,323 B2 * | 4/2010 | Tagami et al. | 365/158 |
| 7,742,328 B2 * | 6/2010 | Chen et al. | 365/158 |
| 8,027,184 B2 * | 9/2011 | Katou | 365/158 |
| 2006/0087880 A1 | 4/2006 | Mancoff et al. | |
| 2010/0110783 A1 | 5/2010 | Liu et al. | |

OTHER PUBLICATIONS

Sousa et al.; "Non-Volatile Magnetic Random Access Memories (MRAM)", Compts Rednus—Physique, Elsevier, Paris France, vol. 6, No. 9, Nov. 1, 2005; pp. 1013-1021.

* cited by examiner

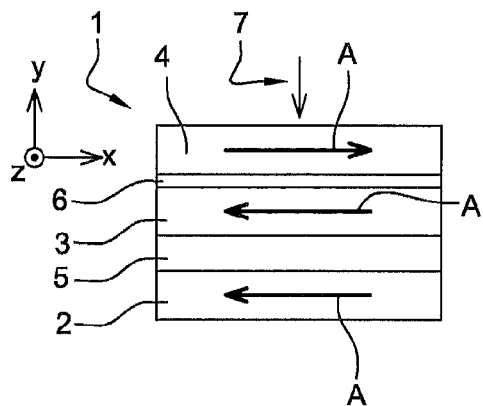
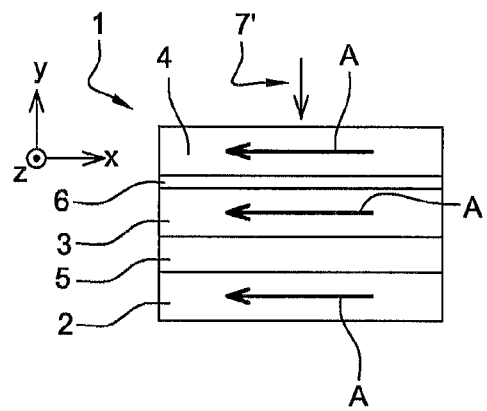
Fig. 1    Fig. 2
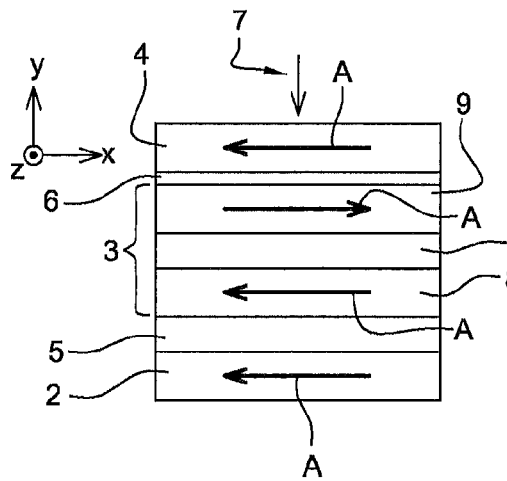
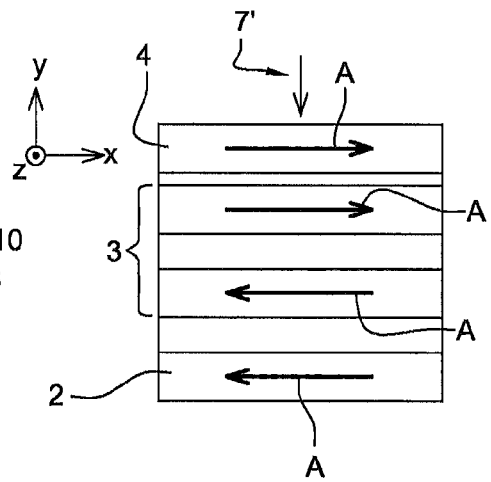
Fig. 3    Fig. 4

MAGNETIC DEVICE, AND METHOD FOR READING FROM AND WRITING TO SAID DEVICE

CROSS-REFERENCE TO RELATED APPLICATIONS

This is the U.S. National Stage of PCT/EP2011/065057, filed Aug. 31, 2011, which in turn claims priority to French Patent Application No. 1056950, filed. Sep. 1, 2010, the entire contents of all applications are incorporated herein by reference in their entireties.

The present invention relates to a magnetic device and a method for reading from and writing to such a magnetic device.

The invention finds use in electronics and in particular in the creation of memory cells and MRAM type memories ("Magnetic Random Access Memory").

Fresh interest has been shown in MRAM magnetic memories with the availability of magnetic tunnel junctions exhibiting a strong magnetoresistance at ambient temperature. MRAM memories comprise a plurality of memory cells. These memory cells are generally magnetic devices which comprise:
- a magnetic layer called a "reference layer" which has a magnetisation, the direction of which is fixed;
- a magnetic layer called a "storage layer" which has a magnetisation, the direction of which is variable and which can be orientated either parallel or anti-parallel to the magnetisation direction of the reference layer;
- an insulating or semi-conducting layer which separates the reference layer and the storage layer.

Document FR2817999 describes such a magnetic device. This magnetic device has two operating modes: a "read" mode and a "write" mode. During the write mode, an electric current, having a write voltage greater than the critical voltage, is sent through the layers, in such a way that it passes through the layers either in one direction or in the opposite direction. This electric current causes the reversal of the magnetisation direction of the storage layer, which then becomes parallel or anti-parallel to the magnetisation direction of the reference layer. Depending on whether the magnetisation direction of the storage layer is parallel or anti-parallel to the magnetisation direction of the reference layer, a "1" or a "0" is stored in the storage layer.

During the read mode, another electric current is injected through the device. This electric current must have a read voltage strictly less than the write voltage. This electric current permits the resistance of the magnetic device to be measured. When the magnetisation directions of the reference layer and the storage layer are parallel, the resistance of the junction is low, whereas when the magnetisation directions of the reference and storage layer are anti-parallel, the resistance of the junction is raised. From a comparison with the reference resistance, the value stored in the storage layer ("0" or "1") can be determined.

Document FR2817999 also proposes the use, as a storage layer, of a tri-layer stack constituted by two magnetic layers with anti-parallel magnetisations separated by a non-magnetic conductive layer.

However, this magnetic device has a number of drawbacks. In the first place, this device has a breakdown voltage above which it becomes damaged. During the write mode, the write voltage therefore has to remain less than the breakdown voltage.

Moreover, the read voltage must remain very much lower than the write voltage in order not to risk changing the magnetisation direction of the storage layer during reading. However, it is not possible to use an excessively low read voltage, because otherwise the reading speed is reduced.

It is therefore difficult to select read and write voltages sufficiently below the breakdown voltage and sufficiently different from one another in order not to risk writing instead of reading, without however excessively reducing the reading speed.

Document FR2832542 also describes a magnetic device with a magnetic tunnel junction, as well as methods of reading and writing using this device. This device comprises a reference layer, having a magnetisation of fixed direction, a storage layer, having a magnetisation whose direction is variable, and an additional polarising layer whose magnetisation direction is fixed and anti-parallel to the magnetisation direction of the reference layer. This additional polarising layer permits the spin transfer on the storage layer to be reinforced during writing, since it permits the spin-polarised electron current coming from the reference layer and the spin-polarised electron current coming from the additional polarising layer to be combined.

However, as in document FR2817999, this magnetic device has an accidental write risk during reading, since the electron current permitting the information in the storage layer to read can accidentally change the magnetisation direction of the storage layer and thus change the information contained in the storage layer.

The invention aims to overcome, at least partially, the drawbacks of the prior art by proposing a magnetic device which permits comparable read and write voltages to be used, without the risk of unintentionally writing at the time of reading.

The invention thus aims to propose a magnetic device that makes it possible to overcome the problem of having to separate the write voltage and read voltage distributions.

To do this, there is proposed according to a first aspect of the invention a magnetic device comprising:
- a first magnetic layer called a "reference layer" having a fixed magnetisation direction;
- a second magnetic layer called a "storage layer" having a variable magnetisation direction, the magnetisation of the storage layer being able to be parallel or anti-parallel to the magnetisation of the reference layer;
- a first spacer separating the reference layer and the storage layer;

said device being characterised in that it also comprises:
- a third magnetic layer called a "control layer" having a variable magnetisation direction, the magnetisation of the control layer being able to be essentially parallel or anti-parallel to the magnetisation of the reference layer;
- a second spacer separating the storage layer and the control layer;
- control means for the direction of magnetisation of the control layer capable of changing the direction of magnetisation of the control layer without changing the direction of magnetisation of the storage layer.

The invention thus permits comparable write and read voltages to be used without the risk of writing during reading by changing the effectiveness of the spin transfer between reading and writing through the orientation of the control layer. This avoids having to read at very low voltages, i.e. less than 0.1 V, which slow down reading considerably.

The magnetic device according to the invention is therefore particularly remarkable in that it comprises, apart from the storage and reference layers, a control layer, the magnetisation direction whereof is variable. The magnetisation direction of this control layer will thus be able to be selected:

either to increase the effectiveness of the spin transfer between an electron current injected through the layers and the storage layer, when it is intended to write to the storage layer;

or to reduce the effectiveness of the spin transfer when it is intended only to read information contained in the storage layer without the risk of changing this information.

Thus, prior to any reading or writing, the magnetisation direction of the control layer will be selected in such a way as to increase the effectiveness of the spin transfer or to reduce it.

More precisely, the magnetic device according to the invention can thus function in the following manner. For the write mode, the magnetisation direction of the control layer is selected so as to promote the spin transfer. This orientation of the magnetisation of the control layer increasing the effectiveness of the spin transfer is essentially anti-parallel to the magnetisation of the reference layer. When it is intended to write to the storage layer, an electron current is sent through the layers, perpendicular to the layers. This electron current passes through the device from one end to the other. Let us assume, in the following discussion, that the electrons circulate from the reference layer towards the storage layer, i.e. that the electric current circulates from the storage layer towards the reference layer. When this electron current passes through the reference layer, which is magnetised in a fixed direction, the electron spins will become polarised according to the magnetisation of the reference layer on account of the electronic structure of the magnetic material constituting the reference layer. For this reason, the electrons will emerge from the reference layer with a polarised spin. When these electrons pass through the storage layer, they will exert a spin transfer torque on the magnetisation of the storage layer, which will tend to align the magnetisation the storage layer parallel to the magnetic moment of the reference layer. Thus, the reference layer will promote the parallel alignment of the magnetisation of the storage layer for this direction of the current. Moreover, since, for the write mode, the magnetisation direction of the control layer has been selected to increase the effectiveness of the spin transfer between the reference layer and the storage layer, the minority spin electrons (i.e. having a spin opposite to the magnetisation of the control layer) will be reflected towards the storage layer. These reflected electrons, which have a spin anti-parallel to the magnetisation of the control layer, i.e. parallel to the magnetisation of the reference layer, will also exert a spin transfer torque promoting the parallel alignment of the magnetisations of the storage and the reference layers. It will thus be understood that the anti-parallel alignment of the magnetisations of the reference and storage layers makes it possible to benefit from a reinforcement of the effectiveness of the spin transfer and thus to facilitate reading by current from the storage layer.

If the direction of the current is now inverted, the spin transfers exerted by the electrons arriving directly from the control layer and electrons reflected by the reference layer will combine to promote the anti-parallel alignment of the magnetisation of the storage layer and the reference layer. Thus, depending on the direction of the current, it will be possible to write either to the parallel configuration (configuration is understood to mean relative alignment of the magnetisation of the reference layer and that of the storage layer), or to the anti-parallel configuration. In the case of writing, the reference and control layers thus cooperate to promote the change in the magnetisation direction of the storage layer. The spin transfer due to the reference layer and the spin transfer due to the control layer are thus cumulative for the write mode.

The control layer thus makes it possible, in the write mode, to combine the spin transfer torque due to the spin-polarised electron current coming from the reference layer with the spin transfer torque due to the spin-polarised electron current coming from the control layer. The write voltage can thus be less than that used in the devices of the prior art, since the spin transfer effect between the electric current and the storage layer is maximised by the presence of the control layer.

In the read mode, on the other hand, the magnetisation direction of the control layer is selected essentially parallel to that of the reference layer. At this time, the spin transfer effects produced by the reference layer and the control layer are subtracted. When the read current circulates through the structure, the direct electrons coming from the reference layer and the reflected electrons coming from the control layer in fact have opposite spin polarisations, causing a reduction in the effectiveness of the spin transfer. This is the case whatever the direction of the read current. The control layer thus makes it possible, in the read mode, to compensate at least partially for the spin transfer torque due to the spin-polarised electron current coming from the reference layer by that due to the spin-polarised electron current coming from the control layer. Thus, in the read mode, the magnetisation direction of the control layer is selected in such a way that the control layer tends to orientate the magnetisation direction of the storage layer in one direction, whereas the reference layer tends to orientate the magnetisation direction of the storage layer in the opposite direction. Thus, the electron current that passes through the layers does not change the magnetisation direction of the storage layer.

The magnetisation device according to the invention thus makes it possible to use electric currents with a comparable read and write voltage, without thereby involving the risk of writing during reading.

According to the invention, the control layer thus permits either the write mode or the read mode to be selected. The magnetisation direction of the control layer is therefore changed according to the invention only when it is intended to change from the read mode to the write mode or vice versa. Consequently, if successive write modes are executed, without a read mode between two write modes, the magnetisation of the control layer is not changed regardless of the logic state that it is intended to write to. Similarly, if, after a write mode, several successive read modes are executed, without a write mode between these successive read modes, the magnetisation of the control layer is not changed between each read event. Once a read or write mode has been selected, the magnetisation of the control layer remains fixed during all the successive write events or all the successive read events.

The direction of magnetisation of the control layer according to the invention is therefore changed solely as a function of the read or write mode in which it is intended to be, and not of the logic state that it is intended to store in the storage layer. Moreover, once the magnetisation of the control layer has been switched to change from one mode to the other, its magnetisation becomes trapped during all the successive write modes as long as these write modes are not interrupted by a read mode. The control layer is therefore produced in a material, the magnetisation direction whereof cannot be changed too easily, as would be the case for a soft ferromagnetic material.

Moreover, the control layer according to the invention facilitates reading, since the magnetoresistance effects coming from the tunnel junction formed by the assembly reference layer/tunnel barrier/storage layer and storage layer/second spacer/control layer are added during reading.

The magnetic device according to the invention can also comprise one or more of the following features, considered individually or in any technically possible combinations.

Each spacer is advantageously constituted by an insulating or semi-conducting material.

Moreover, the direction of magnetisation of the storage layer on the one hand and the direction of magnetisation of the control layer on the other hand must be able to be controlled separately from one another, without the changing of one of these magnetisation directions changing the other of these magnetisation directions.

In particular, the magnetisation direction of the storage layer must be able to be switched without the magnetisation direction of the control layer varying, and vice versa.

To achieve this, the magnetisation direction of the storage layer and the magnetisation direction of the control layer will be changed by various methods. For example, the magnetisation direction of the storage layer will be changed by spin transfer with the aid of a current circulating perpendicular to the plane of the layers, whereas the magnetisation direction of the control layer will be changed by magnetic field or by wall propagation parallel to the plane of the layers.

According to a preferred embodiment, the storage layer is formed by a first so-called "synthetic antiferromagnetic" tri-layer stack constituted by two magnetic layers separated by a non-magnetic conductive layer, the two magnetic layers being coupled anti-parallel through the non-magnetic conductive layer. This synthetic antiferromagnetic tri-layer stack is preferably constituted by two magnetic layers, typically of CoFe or CoFeB, separated by a non-magnetic conductive layer, typically of ruthenium Ru preferably of thickness between 0.5 nm and 0.9 nm. In this embodiment, the two magnetic layers of the synthetic antiferromagnetic tri-layer stack have an anti-parallel magnetic coupling through the non-magnetic conductive layer. According to the invention, the magnetic moments of the two magnetic layers of the synthetic antiferromagnetic tri-layer stack are advantageously selected essentially equal, such that the total moment of the synthetic antiferromagnetic tri-layer stack is close to zero, typically that the total moment is a fraction which is less than 30% of the moment of one of the two constituent ferromagnetic layers and preferably less than 15%.

In this document, "magnetic moment" of a magnetic layer refers to the magnetic moment of a magnetic layer per unit area, i.e. the product of the magnetisation of the magnetic layer multiplied by the thickness of this magnetic layer.

This embodiment is advantageous, because it makes it possible to have a more uniform magnetisation and it makes it possible to have a greater thermal stability, since the volume of the storage layer is greater. It is known that the magnetisation direction of such a tri-layer stack can be changed by spin transfer, i.e. that the magnetisations of the magnetic layers constituting the tri-layer stack, whilst remaining anti-parallel with one another, can be switched from one direction to the opposite direction under the effect of a spin-polarised current passing through the structure. On the other hand, since this tri-layer stack has an overall magnetic moment of virtually zero, it will react very little with a magnetic field. As we shall see below, by selecting a control layer constituted by a single magnetic layer, it is thus possible to reverse the magnetisation of the control layer by magnetic field, since its magnetic field is not zero, without reversing the magnetisation of the tri-layer stack whose moment is virtually zero.

When the storage layer is formed by a tri-layer stack, the magnetisation direction of the control layer is preferably controlled in such a way that, in write mode, the control layer has a magnetisation direction parallel to the magnetisation direction of the reference layer. Thus, the spin transfer due to the reference layer and the spin transfer due to the control layer are cumulative over the whole of the tri-layer stack that forms the storage layer. In contrast, in read mode, the magnetisation direction of the control layer is preferably controlled in such a way that the control layer has a magnetisation direction anti-parallel to the magnetisation direction of the reference layer. Thus, the spin transfers due to the reference layer and the control layer cancel out.

According to another embodiment, the storage layer is formed by a monolayer of magnetic material.

In this case, the magnetisation direction of the control layer is controlled in such a way that, in the write mode, it is anti-parallel to the magnetisation direction of the reference layer. Thus, in the write mode, the spin transfers due to the control layer and the reference layer are cumulative. In contrast, in the read mode, the magnetisation direction in the control layer is selected in such a way that it is parallel to the magnetisation direction of the reference layer, such that the spin transfers due to the control layer and the reference layer compensate for one another.

The control layer is advantageously formed by a monolayer of a magnetic material.

According to the invention, the magnetisation direction of the control layer must be able to be changed without changing the magnetisation direction of the storage layer. For this purpose, the control means for the direction of magnetisation of the control layer must be capable of changing the direction of magnetisation of the control layer without changing the direction of magnetisation of the storage layer.

According to an embodiment, the control means for the direction of magnetisation of the control layer comprise means of generating a magnetic field having a direction parallel or anti-parallel to the direction of magnetisation of the reference layer. This embodiment is particularly advantageous when the storage layer is formed by a synthetic antiferromagnetic tri-layer stack comprising two magnetic layers coupled anti-parallel through a non-magnetic conductive layer. In this case, the magnetic layers of the tri-layer stack preferably have magnetisations which compensate for one another and, consequently, the magnetic field has virtually no influence on the storage layer. Consequently, the magnetisation directions of the magnetic layers that form the storage layer do not vary. In contrast, the control layer, which is alone, is sensitive to the magnetic field, so that its magnetisation changes direction under the effect of the magnetic field.

The means of generating a magnetic field can comprise at least one conductor, through which a current runs in one direction or the other so as to create a magnetic field parallel or anti-parallel to the magnetisation direction of the reference layer.

When the control, storage and reference layers are polarised in the plane in which they are located, for example when these layers extend in a longitudinal direction and their magnetisation directions are parallel or anti-parallel to this magnetisation direction, the control means preferably comprise a conductor which extends parallel to the plane in which the control, storage and reference layers are located and which is aligned, in the longitudinal direction, with the control, storage and reference layers. In this way, the current that passes through the first conductor permits the creation of a magnetic field which is parallel or anti-parallel to the magnetisation direction of the control layer.

In contrast, when the control, storage and reference layers are polarised out of the plane in which they are located, for example when these layers extend in a longitudinal direction and their magnetisation directions are parallel or anti-parallel to a transverse direction perpendicular to this longitudinal direction, the control means preferably comprise two conductors which each extend parallel to the plane in which the reference, storage and control layers are located, and these conductors are offset, in the longitudinal direction, with respect to the control layer and located on each side of the control layer. Electric currents, which are in opposite directions to one another, preferably pass through these two conductors. Thus, these two conductors permit the creation of a magnetic field parallel or anti-parallel to the magnetisation direction of the reference layer.

According to another embodiment, the control means for the direction of magnetisation in the control layer comprise means of injection, into the control layer, of electrons polarised parallel or anti-parallel to the direction of magnetisation of the reference layer. These means of injection preferably inject electrons into the control layer in such a way that they pass through the control layer in the longitudinal direction.

Instead of changing the magnetisation direction of the control layer thanks to a magnetic field, it is in fact also possible to change this magnetisation direction by wall propagation induced by current using the spin transfer effect. In this case, the control layer is a current-conducting layer in which a magnetic domain is created which has the desired magnetisation direction. This magnetic domain is then extended to the whole of the control layer by sending the electric current through the control layer. The walls of the magnetic domain are then propagated through the control layer under the effect of the pressure exerted by the electron current due to the spin transfer.

More precisely, according to this embodiment, a spin-polarised electron current is injected into a first end of the control layer. This electron current can for example have been spin-polarised by causing it to pass through a layer of magnetic material having a fixed magnetisation direction. The electrons are thus injected into the control layer having a polarised spin. When the control layer has a magnetisation anti-parallel to the spin direction of the electrons, the injection of the electron current into the control layer makes it possible, for example, to nucleate a magnetic domain in the control layer, this domain having a magnetisation parallel to the spin direction of the electrons. When the electrons circulate longitudinally through the control layer, they push back the walls which delimit this domain, in such a way as to extend the domain through the control layer, so that, when the electrons reach the second end of the control layer, the domain is extended to the whole control layer. The whole of the control layer then has the desired magnetisation direction. By selecting the direction of the current that passes through the control layer, it is thus possible to control the magnetisation direction of the control layer. This embodiment makes it possible to change the magnetisation direction of the control layer without changing the magnetisation direction of the storage layer.

The means of injection of polarised electrons into the control layer preferably comprise:
  a stack disposed in contact with a first end of the control layer, the stack comprising:
    a second conductor;
    an antiferromagnetic material;
    a layer of magnetic material having a fixed magnetisation;
    a third conductor;
  a current generator capable of sending an electric current in such a way that it passes through the stack in one direction or in the opposite direction;
  a fourth conductor disposed in contact with the second end of the control layer.

The stack makes it possible to spin-polarise the electrons before they are injected into the first end of the control layer. The electrons then pass through the control layer longitudinally until they reach the fourth conductor.

According to a preferred embodiment, the magnetic device according to the invention also comprises:
  a second layer of antiferromagnetic material disposed against the control layer;
  means of controlling the temperature of the second layer of antiferromagnetic material.

This embodiment makes it possible to increase the stability of the control layer once its magnetisation direction has been selected. When it is intended to change the direction of the control layer, the second layer of antiferromagnetic material is heated. The antiferromagnetic second layer then becomes paramagnetic and it is then easily possible to change the magnetisation direction of the control layer. On the other hand, when it is not intended to change the magnetisation direction of the control layer, the heating of the antiferromagnetic second layer is stopped, which then traps the magnetisation of the control layer in the direction in which it finds itself. It is then possible to change the direction of the storage layer, without the risk of changing the magnetisation direction of the control layer.

Although this embodiment is compatible with all the control means for the direction of magnetisation of the control layer, this embodiment is particularly advantageous when it is used with control means for the magnetisation direction of the control layer constituted by means of generating a magnetic field having a direction parallel or anti-parallel to the direction of magnetisation of the reference layer, and in particular when these means of generating a magnetic field comprise a first conductor through which an electric current passes. In this case, the means of controlling the temperature of the second layer of antiferromagnetic material can comprise a fifth conductor having a high resistance, which is disposed between the first conductor through which the electric current passes, which permits the magnetic field to be generated, and the second layer of antiferromagnetic material. When the current passes through the first conductor to generate a magnetic field permitting the magnetisation direction of the control layer to be changed, this current is also propagated into the fifth conductor, which it heats by the Joule effect. The second layer of antiferromagnetic material is then automatically heated as soon as a magnetic field is created.

According to another embodiment, it is also possible to control the heating of the second layer of antiferromagnetic material independently of the creation of the magnetic field by electrically insulating the first conductor and the fifth conductor and by causing two different currents to pass through these two conductors.

According to various embodiments:
  the reference layer, the storage layer and the control layer extend in a longitudinal direction, the magnetisations of the reference layer, the storage layer and the control layer being aligned with the longitudinal direction. In this case, the magnetisations of the reference, storage and control layers are said to be "in-plane";
  the reference layer, the storage layer and the control layer extend in a longitudinal direction, the magnetisations of the reference layer, the storage layer and the control layer being perpendicular to the longitudinal direction. In this case, the magnetisations of the reference, storage and control layers are said to be "out-of-plane"; this latter embodiment is particularly advantageous, because the magnetic device thus created has an improved thermal stability.

The magnetic device according to the invention advantageously also comprises means of writing information to the storage layer, said means being capable of causing a first electric current to circulate through the layers, in one direction or in the opposite direction.

The magnetic device according to the invention advantageously also comprises:
means of reading information contained in the storage layer, said means being capable of causing a second electric current to circulate through the layers;
means of measuring the voltage at the terminals of the layers.

The second electric current advantageously has a voltage less than or equal to the voltage of the first electric current.

The invention also relates to a method of reading information contained in a device according to the invention and a method of writing information to a device according to the invention.

When the storage layer comprises a synthetic antiferromagnetic tri-layer formed by two magnetic layers separated by a non-magnetic conductive layer, the method of writing according to the invention advantageously comprises, prior to the step of changing the magnetisation direction of the storage layer, a step for controlling the direction of magnetisation of the control layer in such a way that the magnetisation direction of the control layer is parallel to the magnetisation direction of the reference layer.

When the storage layer comprises a synthetic antiferromagnetic tri-layer formed by two magnetic layers separated by a non-magnetic conductive layer, the method of reading according to the invention advantageously comprises, prior to the step of reading the magnetisation direction of the storage layer, a step for controlling the direction of magnetisation of the control layer in such a way that the magnetisation direction of the control layer is anti-parallel to the magnetisation direction of the reference layer.

When the storage layer is a magnetic monolayer, the method of writing according to the invention advantageously comprises, prior to the step of changing the magnetisation direction of the storage layer, a step for controlling the direction of magnetisation of the control layer in such a way that the magnetisation direction of the control layer is anti-parallel to the magnetisation direction of the reference layer.

When the storage layer is a magnetic monolayer, the method of reading according to the invention advantageously comprises, prior to the step of reading the magnetisation direction of the storage layer, a step for controlling the direction of magnetisation of the control layer in such a way that the magnetisation direction of the control layer is parallel to the magnetisation direction of the reference layer.

Figure 6:
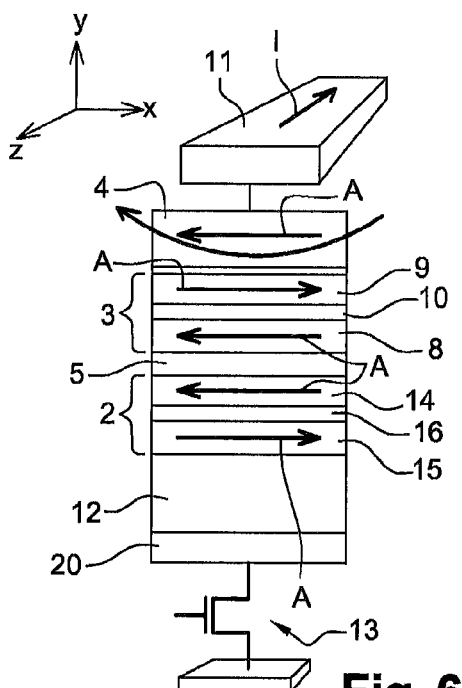
Figure 7:
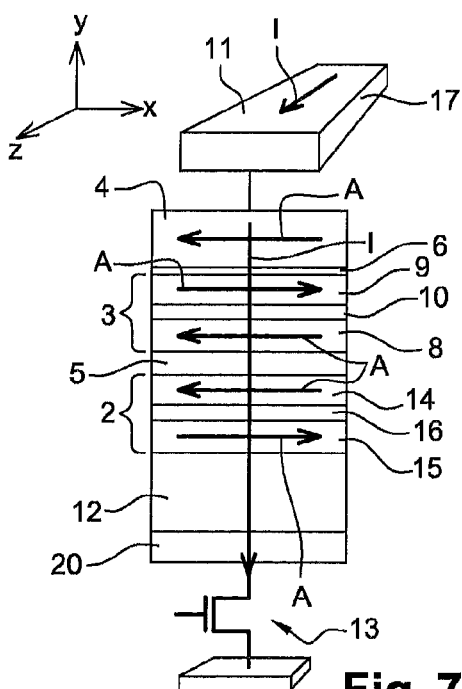
Figure 8:
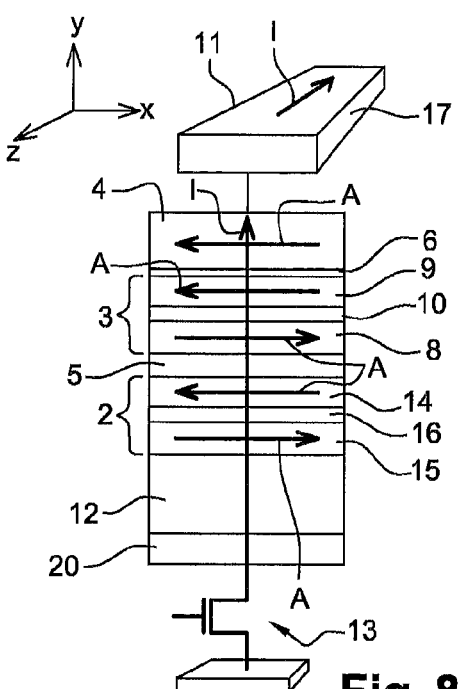
Figure 9:
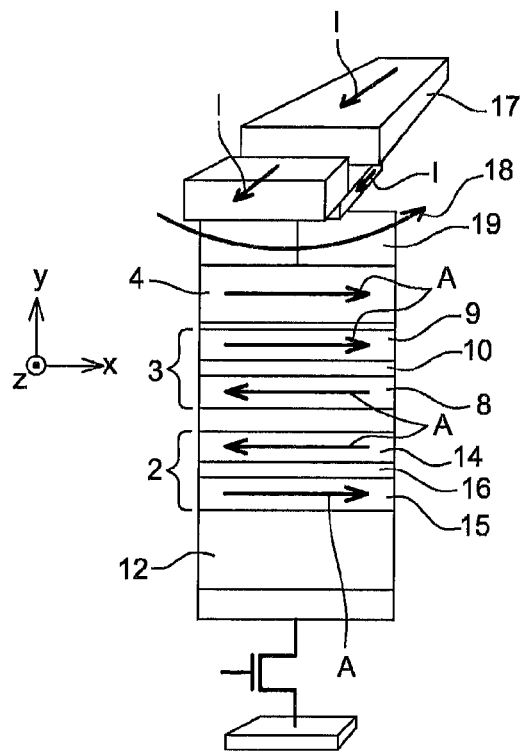
Figure 10:
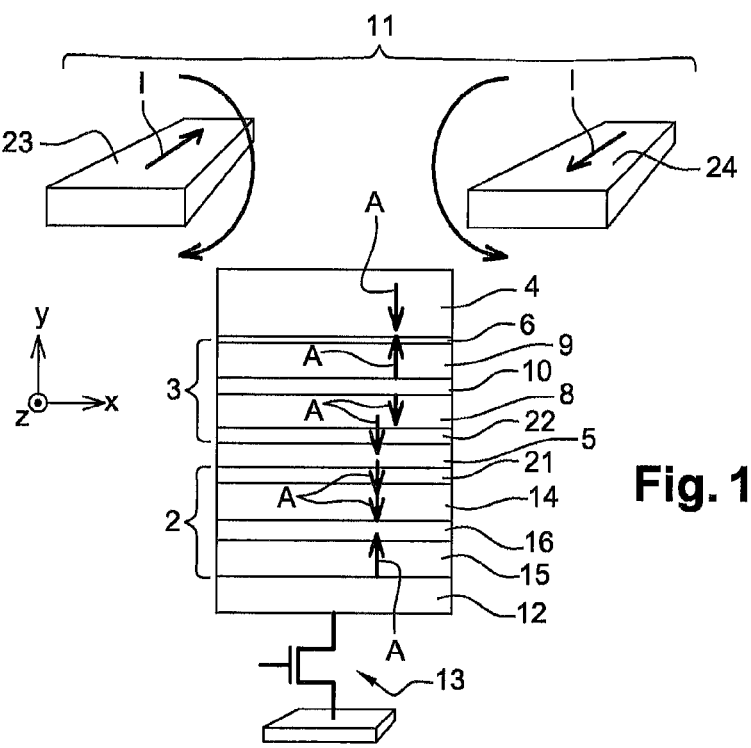
Figure 11:
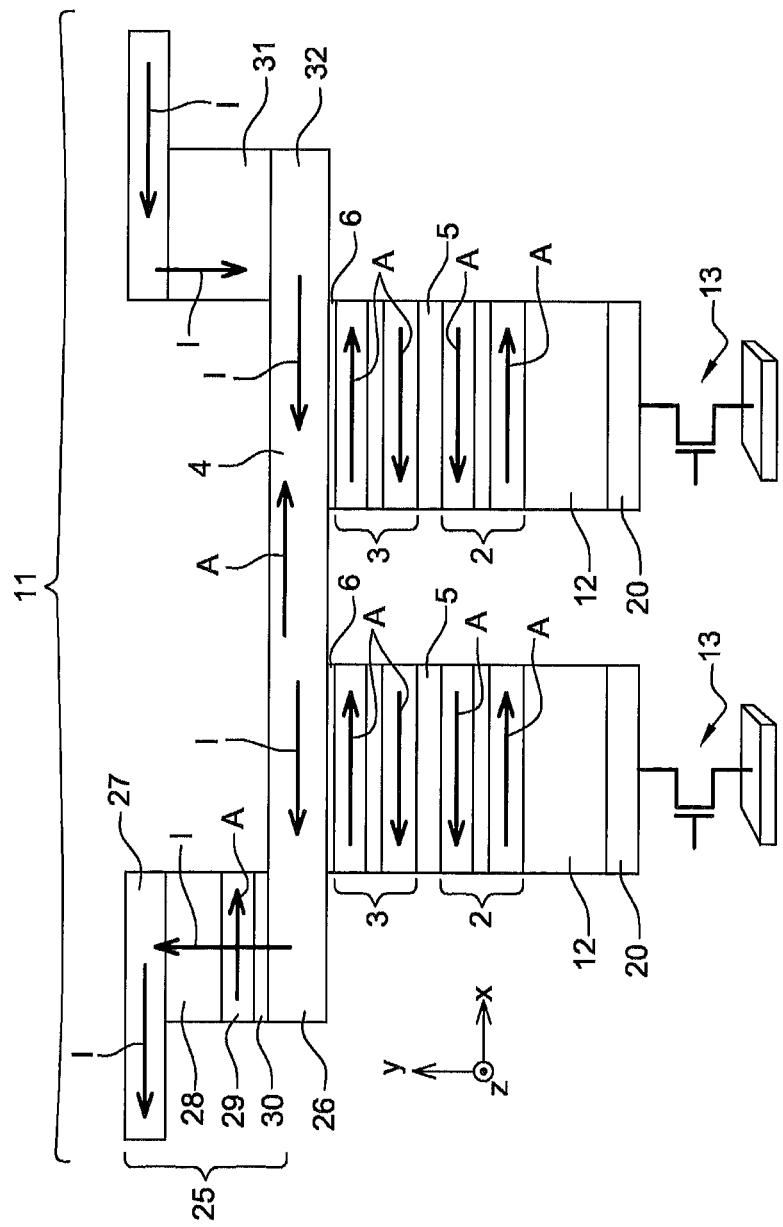
Figure 12:
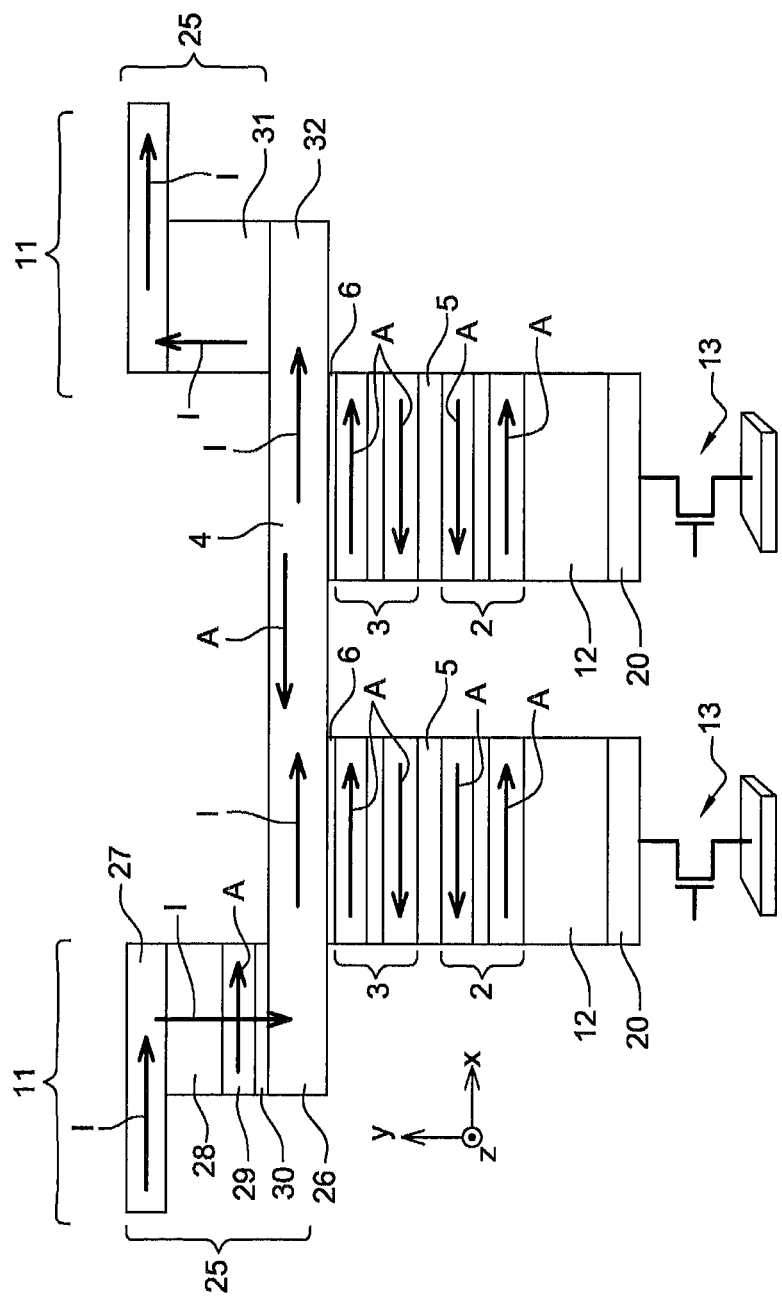
Figure 13:
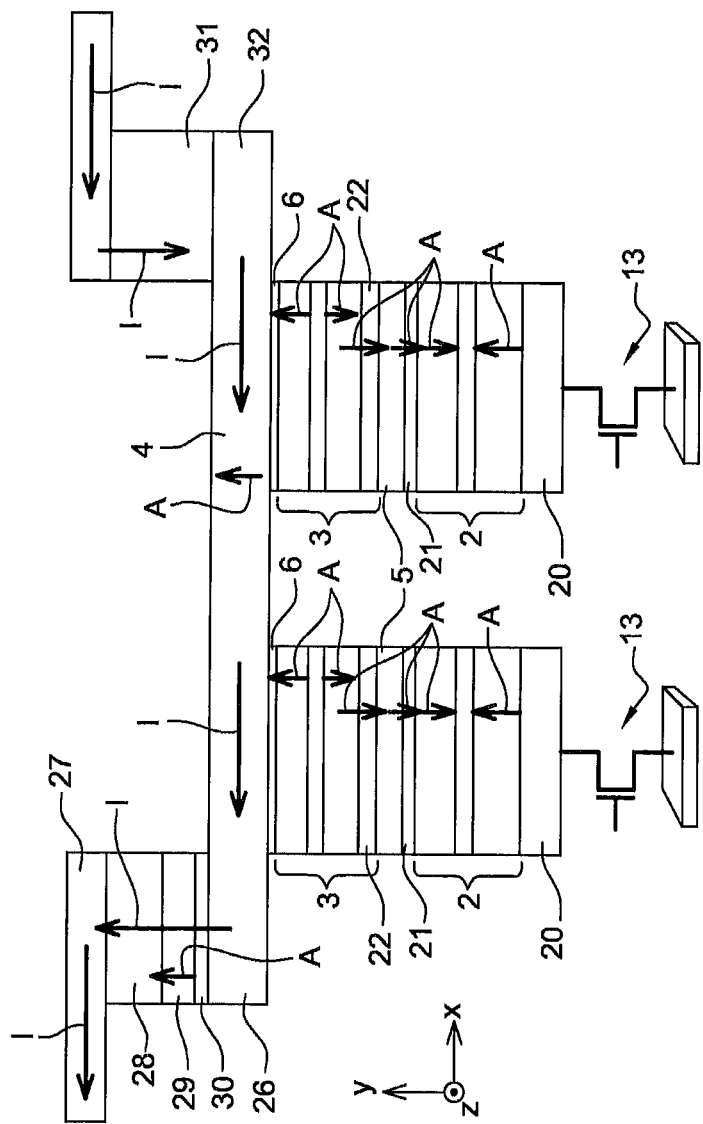

Other features and advantages of the invention will emerge from a reading of the following description, making reference to the appended figures which illustrate:

FIG. 1, a cross-sectional view of a magnetic device according to an embodiment of the invention in write mode;

FIG. 2, a cross-sectional view of the device from FIG. 1, in read mode;

FIG. 3, a cross-sectional view of a device according to another embodiment of the invention in write mode;

FIG. 4, a cross-sectional view of the device from FIG. 3, in read mode;

FIG. 5, a cross-sectional view of a device according to another embodiment of the invention, in read mode;

FIG. 6, a cross-sectional view of the device from FIG. 5, in write mode;

FIG. 7, a cross-sectional view of the device from FIG. 5 during the writing of a "0";

FIG. 8, a cross-sectional view of the device from FIG. 5 during the writing of a "1";

FIG. 9, a cross-sectional view of a device according to another embodiment of the invention involving thermally assisted writing to the control layer;

FIG. 10, a cross-sectional view of a device according to another embodiment of the invention in write mode;

FIG. 11, a cross-sectional view of a device according to another embodiment of the invention in read mode;

FIG. 12, a cross-sectional view of the device from FIG. 11 in write mode;

FIG. 13, a cross-sectional view of a device according to another embodiment of the invention in read mode.

For the sake of greater clarity, identical or similar elements are referred to by identical reference symbols in all the figures.

In all the figures, the arrows designated by reference A represent the magnetisation direction of the various magnetic layers and the arrows designated by reference I represent an electric current.

FIG. 1 represents a magnetic device 1 according to an embodiment of the invention. This magnetic device 1 comprises:
a first magnetic layer called a "reference layer" 2,
a second magnetic layer called a "storage layer" 3,
a third magnetic layer called a "control layer" 4.

Reference layer 2 and storage layer 3 are separated by a first spacer 5. Control layer 4 and the storage layer are separated by a second spacer 6.

In this embodiment, layers 2 to 6 extend in a longitudinal direction 1 parallel to the x axis.

Throughout this document, "longitudinal direction" refers to the direction parallel to the x axis and "transverse direction" refers to the direction parallel to the y axis.

In this embodiment, reference layer 2, storage layer 3 and control layer 4 have "in-plane" magnetisations, i.e. the magnetisations of these layers are directed in the longitudinal direction.

Reference layer 2 has a magnetisation of fixed direction, represented by an arrow in FIGS. 1 and 2. The magnetisation direction of reference layer 2 can for example be fixed by exchange coupling with a first antiferromagnetic layer. This reference layer 2 can also be a synthetic antiferromagnetic layer trapped by an antiferromagnetic layer.

The storage and control layers have magnetisations of variable direction: the magnetisations of these storage 3 and control 4 layers can be orientated either parallel or anti-parallel to the magnetisation direction of the reference layer.

Storage layer 3 is a monolayer produced in a magnetic material, for example an alloy of cobalt-iron-boron CoFeB. This magnetic material is of course given merely by way of example and it could also be envisaged to produce storage layer 3 in other magnetic materials, for example in CoFe, Fe, or alloys based on Ni, Fe and Co.

Reference layer 2 is also a monolayer, which is produced for example in CoFeB or CoFe.

First and second spacers 5, 6 are constituted by an insulating or semi-conducting layer, for example of MgO or aluminium $Al_2O_3$.

Magnetic device 1 can function according to a write mode and a read mode.

In the write mode, represented in FIG. 1, the magnetisation of control layer 4 is selected such that it is anti-parallel to the magnetisation direction of the reference layer. The magnetisation of the reference layer is directed along axis (−x) and the magnetisation of the control layer is directed along axis (+x).

When a first electron current 7 is sent along axis (−y) through layers 2 to 6, the conduction electrons pass through the reference layer and the spin of these electrons is polarised upon passing through this reference layer. The polarised electrons then exert a spin transfer torque on the magnetisation of the storage layer. Moreover, the electrons reflected by control layer 4, which are spin-polarised anti-parallel to the magnetisation of the control layer, also exert a spin transfer torque on the magnetisation of storage layer 3. The spin transfer torque is therefore reinforced by the joint action of reference layer 2 and control layer 3, since these two layers have anti-parallel magnetisation directions. This spin transfer makes it possible to direct the magnetisation of the storage layer either parallel or anti-parallel to the magnetisation direction of the reference layer, depending on whether the electron current that passes through layers 2 to 6 is directed along axis (−y) or (+y).

The presence of the control layer thus makes it possible to facilitate the writing of information to the storage layer.

In the read mode, represented in FIG. 2, the magnetisation of control layer 4 is selected such that it is parallel to the magnetisation of reference layer 2.

To read the information stored in the storage layer, a second electron current 7' is sent through the stack of layers 2 to 6, perpendicular to layers 2 to 6. This second electron current 7' makes it possible to measure the resistance of magnetic device 1. When the storage and reference layers have anti-parallel magnetisations, the resistance of the device is raised. On the other hand, when the storage and reference layers have parallel magnetisations, the resistance of the device is low. Second electron current 7' must therefore permit the information contained in the storage layer to be read without thereby changing this information.

For this purpose, the reference layer and the control layer, which have parallel magnetisations, exert opposite actions on the storage layer, since they both tend to orientate the magnetisation of the storage layer in opposite directions. Despite the second electron current being sent through the layers, the magnetisation direction of the storage layer does not therefore vary.

The magnetic device according to the invention thus makes it possible to send electric currents of comparable voltage in read mode and write mode, without the information contained in the storage layer varying in the read mode.

FIGS. 3 and 4 represent another embodiment, wherein storage layer 3 is constituted by a synthetic antiferromagnetic tri-layer stack which comprises two layers of magnetic material 8 and 9 separated by a layer of non-magnetic conductive material 10. The two layers of magnetic material are for example constituted by an alloy of cobalt-iron-boron CoFeB or CoFe, and the layer of non-magnetic conductive material 10 is for example constituted by ruthenium Ru with a thickness between 0.5 nm and 0.9 nm.

The two layers of magnetic material 8 and 9 are coupled magnetically through the layer of non-magnetic conductive material 10 in such a way that their magnetisations have anti-parallel magnetisation directions. The two layers of magnetic material 8 and 9 preferably have the same magnetic moment, i.e. the same product of magnetisation times thickness, in such a way such that their magnetic moments are balanced out and therefore that the tri-layer stack has overall a magnetic moment of virtually zero.

When the storage layer is formed by a synthetic antiferromagnetic tri-layer stack, "magnetisation direction of the storage layer" or "direction of magnetisation of the storage layer" refers to the direction of magnetisation of the magnetic layer which belongs to the storage layer and which is located closest to the reference layer.

Reference layer 2, first spacer 5, control layer 4 and second spacer 6 can be identical to those described by reference to FIGS. 1 and 2.

In this embodiment, in the write mode, represented in FIG. 3, the control layer must have a magnetisation parallel to the magnetisation of the reference layer. In the write mode, when an electric current passes through the stack, reference layer 2 in fact tends to orientate the magnetisation of the layer of magnetic material 8 in one direction. To promote writing, it is therefore necessary that control layer 4 tends to orientate the magnetisation of the layer of magnetic material 9 in the opposite direction, since the layers of magnetic material 8 and 9 are coupled anti-parallel.

In contrast, in the read mode, represented in FIG. 4, it is desired to prevent the magnetisations of the layers of magnetic material 8 and 9 from changing orientation. For this purpose, control layer 4 must have a magnetisation anti-parallel to the magnetisation direction of reference layer 2. Thus, when a second electric current 7' passes through the layers, the reference layer tends to orientate the magnetisation of the layer of magnetic material 8 in one direction, and the control layer tends to orientate the magnetisation of the layer of magnetic material 9 in the same direction, which tends to neutralise the change in the magnetisation directions of the layers of magnetic material 8 and 9, since these two layers are coupled anti-parallel.

Accidental reversals of the magnetisation direction of the storage layer during reading are thus avoided.

This embodiment, in which the storage layer is constituted by a tri-layer stack, is advantageous because the magnetisation of the storage layer is more uniform. In the case of a storage layer formed by a tri-layer stack, there is in fact a flux closure phenomenon between the two magnetic layers 8 and 9. Moreover, the thermal stability of the storage layer is increased, because the volume of the storage layer is greater.

FIGS. 5 and 6 represent a magnetic device according to another embodiment, wherein storage layer 3 is constituted by a first tri-layer stack which comprises two magnetic layers 8 and 9 coupled anti-parallel through a layer of non-magnetic conductive material 10. The magnetisation directions of the two magnetic layers constituting the storage layer can vary.

In this embodiment, reference layer 2 is also constituted by a tri-layer stack which comprises two magnetic layers 14 and 15 coupled anti-parallel through a non-magnetic conductive layer 16. When the reference layer is constituted by a tri-layer stack, "magnetisation direction or direction of magnetisation of the reference layer" refers to the magnetisation direction of the magnetic layer of the tri-layer stack that is located closest to the storage layer.

The magnetic device according to this embodiment also comprises a first layer of antiferromagnetic material 12, for example an alloy of platinum and manganese PtMn of thickness between 12 nm and 20 nm, disposed against reference layer 2 and intended to fix the magnetisation direction of magnetic layers 14 and 15 which constitute reference layer 2. Reference layer 2 can be a synthetic antiferromagnetic tri-layer constituted by two layers of CoFeB or CoFe coupled anti-parallel through a thin layer of ruthenium Ru of thickness between 0.5 nm and 0.9 nm. A typical composition of this synthetic antiferromagnetic layer could be a layer of CoFe of thickness 2 nm, a layer of ruthenium of thickness 0.6 nm and a layer of CoFeB of thickness 2.5 nm.

Magnetic layers 8, 9, 14 and 15 can for example be produced in an alloy of cobalt-iron-boron and the non-magnetic conductive layers 10 and 16 can for example be produced in ruthenium Ru. Magnetic layers 8 and 9 preferably have the same product of magnetisation times thickness, such that their magnetic moments are balanced out. Similarly, magnetic layers 14 and 15 preferably have the same product of magnetisation times thickness, such that their magnetisation moments are balanced out. The thicknesses of each of these magnetic layers are typically between 1.5 nm and 4 nm.

The reference layer could also be formed by a magnetic monolayer as in the previous embodiment.

Control layer 4 can be produced in an alloy of cobalt-iron-boron CoFeB, or CoFe or Fe of thickness typically between 4 nm and 8 nm. The magnetisations of magnetic layers 4, 8, 9, 14 and 15 are parallel or anti-parallel to the x axis along which magnetic layers 4, 8, 9, 14 and 15 extend.

The magnetic device also comprises a transistor 13.

The magnetic device also comprises control means 11 for the magnetisation direction of control layer 4 capable of changing the direction of magnetisation of the control layer without changing the direction of magnetisation of storage layer 3. In this embodiment, control means 11 comprise a conductor 17 which extends along the z axis and which is aligned with the control layer along transverse direction y. Control means 11 also comprise means of sending (not shown) a current into conductor 17. When an electric current passes through conductor 17, this generates a magnetic field 18, which can be parallel or anti-parallel to the magnetisation direction of reference layer 2. This magnetic field thus makes it possible to orientate the magnetisation of the control layer parallel or anti-parallel to the magnetisation direction of the reference layer.

In this embodiment, the magnetic field has no significant influence on the orientation of the magnetisation of magnetic layers 8 and 9, which constitute the storage layer, since the magnetic moments of magnetic layers 8 and 9 are offset [or close to being offset]. The two magnetic layers 8 and 9, which are coupled anti-parallel, in fact have opposite magnetic moments, such that the total magnetic moment of the storage layer is virtually zero. The magnetic field created by control means 11 does not therefore have any influence on the storage layer. On the other hand, it makes it possible to change the magnetisation direction of the control layer, which is not coupled magnetically to any other layer.

Thus, prior to the reading of information contained in the storage layer (FIG. 5), an electric current is sent along axis +z through conductor 17. This electric current creates a magnetic field anti-parallel to the magnetisation of layer 14 of the reference layer, which causes the alignment of the magnetisation of the control layer anti-parallel to the magnetisation direction of the layer through the reference, storage and control layers so as to read the information contained in the storage layer, the spin transfer created by the control layer and the spin transfer created by the reference layer being compensated, which makes it possible to limit the risks of changing the magnetisation direction of layers 8 and 9 which constitute the storage layer.

In contrast, prior to changing the information contained in the storage layer (FIG. 6), i.e. to writing information to the storage layer, an electric current is sent along axis −z through conductor 17 so as to create a magnetic field, which causes the alignment of the magnetisation of the control layer parallel to the magnetisation of magnetic layer 14 of reference layer 2.

FIG. 7 next represents the method of writing a "0" in the storage layer. For this purpose, an electric current is sent through the reference, storage and control layers in such a way that this electric current passes through the layers perpendicular to the layers. The current must be sent along axis (−y). Reference layer 2, and more precisely magnetic layer 14 of reference layer 2, then tends to orientate the magnetisation of magnetic layer 8 parallel to the magnetisation direction of magnetic layer 14. Control layer 4 tends to orientate the magnetisation of magnetic layer 9 anti-parallel to the magnetisation direction of the control layer. The reference and control layers thus cooperate in such a way as to orientate the magnetisation direction of the storage layer in the same direction. During this writing process, it is important that the control layer does not switch under the effect of the spin transfer torque exerted by the other magnetic layers on the magnetisation of the control layer. For this purpose, it suffices to select a sufficient thickness of the control layer, typically above 4 nm, in order that the magnetisation of the control layer can resist the spin transfer torque that permits the magnetisation direction of the storage layer to be changed. It is in fact known that the spin transfer torque is essentially interfacial. The critical current density required for switching the magnetisation of the control layer thus varies proportional to the thickness of the layer. By increasing the thickness of the control layer, the impact on the control layer of the spin transfer torque is thus minimised without thereby making its switch by field more difficulty, since the applied field acts on the whole volume of the layer.

FIG. 8 represents the method of writing a "1" in the storage layer. For this purpose, an electric current is sent through the reference, storage and control layers in such a way that this electric current passes through the layers perpendicular to the layers. The current has to be sent along axis (+y). Reference layer 2, and more precisely magnetic layer 14 of reference layer 2, thus tends to orientate the magnetisation of magnetic layer 8 anti-parallel to the magnetisation direction of magnetic layer 14. The control layer, for its part, tends to orientate the magnetisation of magnetic layer 9 parallel to the magnetisation direction of the control layer. The reference and control layers thus cooperate in such a way as to orientate the magnetisation direction of the storage layer in the same direction.

In this embodiment, conductor 17 simultaneously permits:
the current to be conducted that makes it possible to create the magnetic field permitting the magnetisation direction of the control layer to be changed and
the electric current to be supplied that passes through reference layer 2, control layer 4 and storage layer 3 in order to read or write information in or to the reference layer.

However, the use of two separate conductors for performing these two functions could also be envisaged.

FIG. 9 represents a magnetic device according to another embodiment. In this embodiment, the magnetic device is similar to that described by reference to FIGS. 5 to 8, except for the fact that it also comprises, between first conductor 17 and control layer 4:
a fifth conductor 18 which produces heat when an electric current passes through it. This fifth conductor 18 is for example constituted by tantalum or tungsten, or can be constituted by the same material as conductor 17, but having a smaller thickness so as to present locally a higher resistance per unit of length; and
a second antiferromagnetic layer 19 in contact with control layer 4 and fifth conductor 18.

According to this embodiment, fifth conductor 18 is in contact with first conductor 17 in such a way that, when a current passes through first conductor 17, it also passes through fifth conductor 18.

In the absence of current through fifth conductor 18, the magnetisation direction of the control layer is frozen by the presence of the second layer of ferromagnetic material 19. The magnetisation direction of the control layer can either be frozen parallel to the magnetisation direction of magnetic layer 14 of the reference layer, or anti-parallel to this magnetisation direction. Thus, it is possible to change the magnetisation direction of the storage layer without changing the magnetisation direction of the control layer.

In contrast, when a current passes through first conductor in order to create a magnetic field with a view to changing the magnetisation direction of the control layer, this current is also propagated into fifth conductor 18. Fifth conductor 18 then produces heat by the Joule effect and it heats the second layer of antiferromagnetic material, in such a way that this second layer of antiferromagnetic material becomes paramagnetic and that the magnetisation direction of the control layer can vary under the effect of the magnetic field created by the passage of the current into conductor 17.

When the current is cut, the second layer of antiferromagnetic material again becomes antiferromagnetic and freezes the magnetisation direction of the control layer.

It would also be possible to use a first conductor 17 and a fifth conductor 18 which are not in contact, so as to be able to control independently the heating of the second layer of antiferromagnetic material and the creation of the magnetic field by first conductor 17.

Heating of the second antiferromagnetic layer by other external heating means could also be envisaged.

Antiferromagnetic layer 19 can be made of FeMn or IrMn or IrMnCr with a blocking temperature typically between 180 and 250° C.

Moreover, the reference layer can be constituted by a single monolayer instead of being formed by a tri-layer stack.

Similarly, the storage layer could be formed by a monolayer instead of being formed by a synthetic antiferromagnetic tri-layer stack. In this case, the storage layer must have a greater coercivity than the coercivity of the control layer in order that the magnetisation direction of the storage layer does not vary when the magnetisation direction of the control layer is changed. It would be possible for example to use a cobalt-chromium alloy to produce the storage layer and a layer of a cobalt-iron-boron alloy for the control layer.

FIG. 10 represents another embodiment, wherein the magnetic layers of the magnetic device have out-of-plane magnetisations. Thus, this magnetic device comprises a reference layer 2, which comprises a tri-layer stack which itself comprises a first magnetic layer 14, a second magnetic layer 15, first and second magnetic layers 14 and 15 being separated by a non-magnetic conductive layer 16 providing an anti-parallel coupling between layers 14 and 15. First and second magnetic layers 14 and 15 can be constituted by a multilayer or an alloy of cobalt-palladium Co/Pd, by a multilayer or an alloy of cobalt-platinum, or a multilayer or an alloy of cobalt-nickel or an alloy of rare earths/transition metals (TbFe for example). Non-magnetic conductive layer 16 which separates the first and the second magnetic layers can for example be constituted by ruthenium of thickness between 0.5 nm and 0.9 nm.

The magnetic device also comprises a storage layer 3, which in the present case comprises a synthetic antiferromagnetic tri-layer stack, which itself comprises a first and a second magnetic layer 8 and 9 separated by a non-magnetic conductive layer 10 providing an anti-parallel coupling between layers 8 and 9. First and second magnetic layers 8 and 9 can be constituted by a multilayer or an alloy of cobalt-palladium Co/Pd, a multilayer or an alloy of cobalt-platinum or again a multilayer or an alloy of cobalt-nickel. Non-magnetic conductive layer 10 which separates the first and the second magnetic layers can for example be constituted by ruthenium of thickness between 0.5 nm and 0.9 nm.

The magnetic device also comprises a control layer 4, constituted for example by CoFeB.

The magnetic device has an out-of-plane orientation, i.e. the reference 2, storage 3 and control layers extend along longitudinal direction x, whilst the magnetisations of magnetic layers 8, 9, 14, 15 extend along transverse direction y or −y. This magnetic device with out-of-plane magnetisation is particularly advantageous, because it has an improved thermal stability compared with magnetic devices with in-plane magnetisation. Materials with out-of-plane magnetisation in fact exhibit an anisotropy of interfacial origin which is greater than that of materials with in-plane magnetisation.

The magnetic device also comprises a first spacer 5 and a second spacer 6, respectively situated between the reference layer and the storage layer, and between the storage layer and the control layer. The two spacers can for example be constituted by MgO or aluminium.

The magnetic device also comprises a buffer layer 12, which permits good growth of the whole of the structure to be promoted. This buffer layer can for example be made of Ta, of Pt, of CuN.

The magnetic device also comprises a transistor 13.

According to this embodiment, reference layer 2 also preferably comprises a first transition layer 21, which is situated between tri-layer stack 14-15-16 and first spacer 5. This transition layer 21 preferably has a centred cubic crystallographic structure when spacer 5 is an MgO tunnel barrier. This transition layer 21 is constituted for example by CoFeB, which crystallises in a centred cubic form in contact with MgO by annealing towards 250° C.-350° C. Layers 14-15-16, which constitute the reference layer, in fact have a hexagonal or face-centred cubic crystallographic structure, whereas first spacer 5, of MgO, has a centred cubic crystallographic structure. Transition layer 21 thus forms a structural transition between reference layer 2 and first spacer 5, which permits the magnetoresistance at first spacer 5 to be increased.

Similarly, storage layer 3 preferably comprises a second transition layer 22, which is situated against first spacer 5. This second transition layer 22 has a centred cubic crystallographic structure and it permits a structural transition to be made between the tri-layer stack of the storage layer, which has a hexagonal or face-centred cubic crystallographic structure, and first spacer 5 which has a centred cubic crystallographic structure. This transition layer 22 is constituted for example by CoFeB.

Each transition layer 21, 22 must have a magnetisation which is parallel to the magnetisation of the magnetic layer, respectively 14, 8 against which it is located. This orientation is acquired, in particular, by the exchange interaction between the magnetisation of these transition layers and the magnetisation of the magnetic layers with which they are respectively in contact.

Similarly, it would also be possible to produce the reference layer and the storage layer in a monolayer, instead of producing them in tri-layer stacks.

The magnetic device also comprises control means 11 for the direction of magnetisation of the control layer, said means being capable of changing the direction of magnetisation of the control layer without changing the direction of magnetisation of the storage layer. Control layer 4 has a magnetisation direction which is parallel or anti-parallel to the y axis and consequently control means 11 are capable of creating a magnetic field which is parallel or anti-parallel to the y axis. For this purpose, control means 11 comprise for example at least two current conductors 23 and 24, which extend along the z axis and which are offset transversely with respect to control layer 4. Current conductors 23 and 24 are thus situated on each side of control layer 4 when one moves along the x axis. Currents I run through the two conductors 23 and 24, said currents running through each of the conductors in the opposite direction from one another. Control means 11 could also comprise a single conductor offset along the x axis with respect to the control layer.

FIGS. 11 and 12 represent another embodiment, wherein control means 11 make it possible to change the magnetisation direction of the control layer by longitudinal wall propagation. FIGS. 11 and 12 represent two magnetic devices according to the invention, which comprise a control layer 4 common to the two magnetic devices, but it would also be possible to produce magnetic devices which each comprise their own control layer without departing from the scope of the invention. Each of these two magnetic devices comprises a reference layer 2, a storage layer 3 and two spacers 5 and 6 similar to those described by reference to FIGS. 5 to 9, but the replacement of the tri-layer stacks by monolayers could also be envisaged without departing from the scope of the invention. Control layer 4 extends along longitudinal direction x. Control means 11 comprise means of injection 25, into control layer 4, of electrons polarised parallel or anti-parallel to the direction of magnetisation of the reference layer. These means of injection 25 comprise a stack disposed in contact with a first end 26 of control layer 4. This stack comprises:
 a second conductor 27, for example of copper;
 an antiferromagnetic material 28;
 a layer of magnetic material having a fixed magnetisation 29, for example a layer of CoFe;
 a third conductor 30, for example of copper.

Means of injection 11 also comprise a current generator (not represented) capable of sending an electric current in such a way that it passes through the stack transversely in one direction or in the opposite direction.

Means of injection 25 also comprise a fourth conductor 31 disposed in contact with a second end 32 of control layer 4.

Means of injection 25 are thus capable of causing to circulate longitudinally, through the control layer, a current of electrons spin-polarised parallel or anti-parallel to the longitudinal direction.

The control layer is a magnetic conductive line and an electric current I, which is spin-polarised, is sent longitudinally through this control layer. For this purpose, the electrons pass through the layer of magnetic material having a fixed magnetisation 29, the magnetisation direction whereof is trapped by antiferromagnetic material 28. The layer of magnetic material having a fixed magnetisation 29 must have a magnetisation direction parallel or anti-parallel to the magnetisation direction of the reference layer. When the electrons are injected into first end 26 of the control layer, they are therefore spin-polarised. These electrons nucleate a domain inside the first end of the control layer, this domain having a magnetisation of desired polarisation. When current I is propagated longitudinally through the control layer, the walls of this domain are pushed back through the whole control layer until these walls reach second end 32 of the control layer and the whole of the control layer then has the desired magnetisation. In order to change the magnetisation direction of the control layer, it suffices to change the propagation direction of current I through the control layer.

Conductors 27, 30 and 31 permit the circulation of the electric current through control layer 4 to be promoted.

FIG. 11 thus represents the magnetic device in read mode, whilst FIG. 12 represents the same magnetic device in write mode.

FIG. 13 represents a magnetic device similar to that of FIGS. 11 and 12, except for the fact that it has an out-of-plane magnetisation. Each magnetic device comprises two transition layers 21, 22 such as those described by reference to FIG. 10.

In the case of an out-of-plane magnetisation, since the layer of magnetic material having a fixed magnetisation 29 has to have a magnetisation direction parallel or anti-parallel to the magnetisation direction of the reference layer, the layer of magnetic material having a fixed magnetisation 29 must also have an out-of-plane magnetisation.

The invention is of course not limited to the embodiments described by reference to the figures and variants can be envisaged without departing from the scope of the invention. In particular, the materials selected to produce the reference layer, the storage layer and the control layer are given merely by way of illustration and other materials could be used.

The invention claimed is:

1. A magnetic device comprising:
 a first magnetic layer having a fixed magnetisation direction;
 a second magnetic layer having a variable magnetisation direction, the magnetisation of the second magnetic layer being able to be orientated either parallel or anti-parallel to the magnetisation of the first magnetic layer;
 a first spacer separating the first magnetic layer and the second magnetic layer;
 a third magnetic layer having a variable magnetisation direction such as to change the magnetic device from a read mode to a write mode and conversely, the magnetisation of the third magnetic layer being able to be controlled in such a way that:
  in the read mode, the third magnetic layer has a magnetisation direction parallel or anti-parallel to the magnetisation direction of the first magnetic layer so as to subtract spin transfer torques exerted by the first magnetic layer and the third magnetic layer on the magnetisation of the second magnetic layer;
  in the write mode, the third magnetic layer has a magnetisation direction:
   parallel to the magnetisation direction of the first magnetic layer when the third magnetic layer has a magnetisation direction anti-parallel to the magnetisation direction of the first magnetic layer in read mode, or
   anti-parallel to the magnetisation direction of the first magnetic layer when the third magnetic layer has a magnetisation direction parallel to the magnetisation direction of the first magnetic layer in read mode;
 a second spacer separating the second magnetic layer and the third magnetic layer;
 a control system for the direction of magnetisation of the third magnetic layer configured to change the direction of magnetisation of the third magnetic layer without changing the direction of magnetisation of the second magnetic layer.

2. The magnetic device according to claim 1, wherein the second magnetic layer has a coercivity greater than the coercivity of the third magnetic layer.

3. The device according to claim 1, wherein the second magnetic layer is formed by a first tri-layer stack constituted by two magnetic layers separated by a non-magnetic conductive layer, the two magnetic layers being coupled anti-parallel through the non-magnetic conductive layer.

4. The magnetic device according to claim 1, wherein the second magnetic layer is formed by a monolayer of magnetic material.

5. The magnetic device according to claim 3, wherein the control system comprises a generator configured to generate a magnetic field having a direction parallel or anti-parallel to the direction of magnetisation of the first magnetic layer.

6. The magnetic device according to claim 1, wherein the control system comprises a device arranged to inject, into the third magnetic layer, electrons polarised parallel or anti-parallel to the direction of the magnetisation of the first magnetic layer.

7. The device according to claim 6, wherein the device arranged to inject, into the third magnetic layer, of polarised electrons comprises:
   a stack disposed in contact with a first end of the third magnetic layer, the stack comprising:
   a second conductor;
   an antiferromagnetic material;
   a layer of magnetic material having a fixed magnetisation;
   a third conductor;
   a current generator capable of sending an electric current in such a way that the electric current passes through the stack in one direction or in the opposite direction;
   a fourth conductor disposed in contact with the second end of the third magnetic layer.

8. The magnetic device according to claim 7, comprising:
   a layer of antiferromagnetic material disposed against the third magnetic layer,
   a controller configured to control the temperature of the layer of antiferromagnetic material.

9. The magnetic device according to claim 1, wherein the first magnetic layer, the second magnetic layer and the third magnetic layer extend in a longitudinal direction, the magnetisations of the first magnetic layer, of the second magnetic layer and of the third magnetic layer being aligned with the longitudinal direction.

10. The magnetic device according to claim 1, wherein the first magnetic layer, the second magnetic layer and the third magnetic layer extend in a longitudinal direction; the magnetisations of the first magnetic layer, of the second magnetic layer and of the third magnetic layer being perpendicular to the longitudinal direction.

11. The magnetic device according to claim 1, comprising a writing system configured to write information to the second magnetic layer, said writing system being capable of causing a first electric current to circulate through the layers, in one direction or in the opposite direction.

12. The magnetic device according to claim 1, comprising:
   a reading system configured to read information contained in the second magnetic layer, said reading system being capable of causing a second electric current to circulate through the layers;
   a measuring system configured to measure the voltage at the terminals of the layers.

13. A method of changing the direction of magnetisation of the second magnetic layer of the magnetic device according to claim 3, comprising, prior to changing the magnetisation direction of the second magnetic layer, controlling the direction of magnetisation of the third magnetic layer in such a way that it is parallel to the magnetisation direction of the first magnetic layer.

14. A method of reading the direction of magnetisation of the second magnetic layer of the magnetic device according to claim 3, comprising, prior to reading the magnetisation direction of the second magnetic layer, controlling the direction of magnetisation of the third magnetic layer in such a way that it is anti-parallel to the magnetisation direction of the first magnetic layer.

15. A method of changing the direction of magnetisation of the second magnetic layer of the magnetic device of claim 4, comprising, prior to changing the magnetisation direction of the second magnetic layer, controlling the direction of magnetisation of the third magnetic layer in such a way that it is anti-parallel to the magnetisation direction of the first magnetic layer.

16. A method of reading the direction of magnetisation of the second magnetic layer of the magnetic device of claim 4, comprising, prior to reading the direction of magnetisation of the second magnetic layer, the direction of magnetisation of the third magnetic layer in such a way that it is parallel to the magnetisation direction of the first magnetic layer.

\* \* \* \* \*